Aug. 6, 1968 J. A. CUNNINGHAM ETAL 3,396,312

AIR-ISOLATED INTEGRATED CIRCUITS

Filed June 30, 1965 3 Sheets-Sheet 1

James A. Cunningham
Elias G. Hanna
INVENTOR.

BY John G. Graham
ATTORNEY

Aug. 6, 1968 J. A. CUNNINGHAM ET AL 3,396,312

AIR-ISOLATED INTEGRATED CIRCUITS

Filed June 30, 1965 3 Sheets-Sheet 2

James A. Cunningham
Elias G. Hanna
INVENTOR.

BY John D. Graham
ATTORNEY

AIR-ISOLATED INTEGRATED CIRCUITS

Filed June 30, 1965 3 Sheets-Sheet 3

James A. Cunningham
Elias G. Hanna INVENTORS

BY John G. Graham

ATTORNEY 3,396,312
Patented Aug. 6, 1968

3,396,312

AIR-ISOLATED INTEGRATED CIRCUITS

James A. Cunningham, Dallas, and Elias G. Hanna, Garland, Tex., assignors to Texas Instruments Incorporated, Dallas, Tex., a corporation of Texas Filed June 30, 1965, Ser. No. 468,227
6 Claims. (Cl. 317—101)

ABSTRACT OF THE DISCLOSURE

An integrated circuit device comprising a body having a plurality of semiconductor regions having coplanar faces. An insulating layer covers at least a portion of the surface. A layer of non-conductive material is disposed upon a portion of the insulating layer between selected ones of said semiconductor devices to mechanically strengthen the body.

This invention relates to integrated circuits, and more particularly to those circuits which use the ambient fabrication atmosphere as their isolation medium.

In a high-speed integrated circuit it is desirable to electrically isolate various portions of the circuit by some means which produces a lower capacitive coupling than that afforded by the conventional PN junction isolation. PN junction isolation is achieved by the use of the high resistance, reverse-bias characteristics of such a junction, said junction being physically located between the elements to be isolated. There are two common ways of building a PN junction isolation region, namely, that of using a diffused collector and that of using an epitaxial collector. Because the reverse biased PN junction can only be used up to a voltage which is determined by the impurity concentrations at the collector-isolation junction, both of these methods produce devices which are voltage limited. In order to make a transistor having a low collector saturation resistance ($R_{cs}$), it is necessary to have a high surface impurity concentration. This high impurity concentration causes the concomitant PN junction breakdown voltage to be low. Thus the conventional PN junction isolation makes it quite difficult to fabricate a device having both high voltage breakdown and low $R_{cs}$ characteristics.

A second disadvantage of PN junction isolation is the capacitive coupling which, existing between isolated islands and the substrate, seriously impairs the ability of the device to operate at the higher frequencies.

There is also a problem in controlling the PNPN action of the active PN junction, such as in a transistor or diode, coupled with the isolation PN junction. This problem can be lessened somewhat by introducing a second epitaxial layer which is, for example, highly N-doped for the case of P-type substrate. This solution is nonetheless plagued with the same problem of attempting to fabricate a low $R_{cs}$, high collector-base breakdown voltage device.

As integrated circuit technology is advancing, additional active and passive elements are being crowded into monolithic semiconductor networks, increasing the number of elements thereon, and placing them into progressively smaller spaces. This reduction in the size of the elements presents a serious problem when attempting to make internal connections between the elements and external connections thereto. A technique to make these connections has been previously developed for making a solid package wherein the bonding of jumper wires is rendered unnecessary by constructing a multilayer lead device with interconnections in thin layers and insulated from the other layers by an insulating material. In this manner, larger contact areas are provided for making external connections to the devices of the network.

Beam lead techniques using thick leads for mechanical support have been developed which utilize air insulation between the components. However, such techniques do not lend themselves to the aforedescribed multilayer lead system because of the thickness of the leads.

It is therefore an object of the invention to provide an integrated circuit device which uses the ambient fabrication atmosphere (air, for example,) as the insulation medium between the elements of the circuit.

It is a further object of the invention to provide an integrated circuit which has an improved mechanical structure.

It is another object of the invention to provide an integrated circuit utilizing air-dielectric insulation which is compatible with multilayer lead techniques.

Other objects and features of the invention will be more readily understood from the following detailed description when read in conjunction with the appended claims and attached drawings, in which:

FIGURE 1(*b*) illustrates a sectional view of the integrated circuit device embodying the circuit of FIGURE 1(*a*);

The invention, in brief, comprises an integrated circuit device completely fabricated through the step, or steps, of applying the metallized contacts, to which circuit is applied a relatively thick layer of nonconductive material, such as the commonly used photoresist materials, the layer being applied to the top surface of the integrated circuit. In the preferred embodiment, the photoresist layer is in the form of either a square or a ring which is applied between the surface areas of the elements of the circuit. The layer is exposed to a light to harden the material to mechanically strengthen the integrated circuit. The back side of the circuit is then selectively etched, such as by using photoresist masking methods, completely through the substrate material to the silicon-oxide layer on the top surface. The selective etching process leaves undisturbed the elements of the surface, except that a moat is created by the etching to provide the isolation desired between the elements. While the etched-out region would ordinarily weaken the structure, the material added to the top of the surface serves to compensate for the etched-out region.

Figures 1A, 1B:
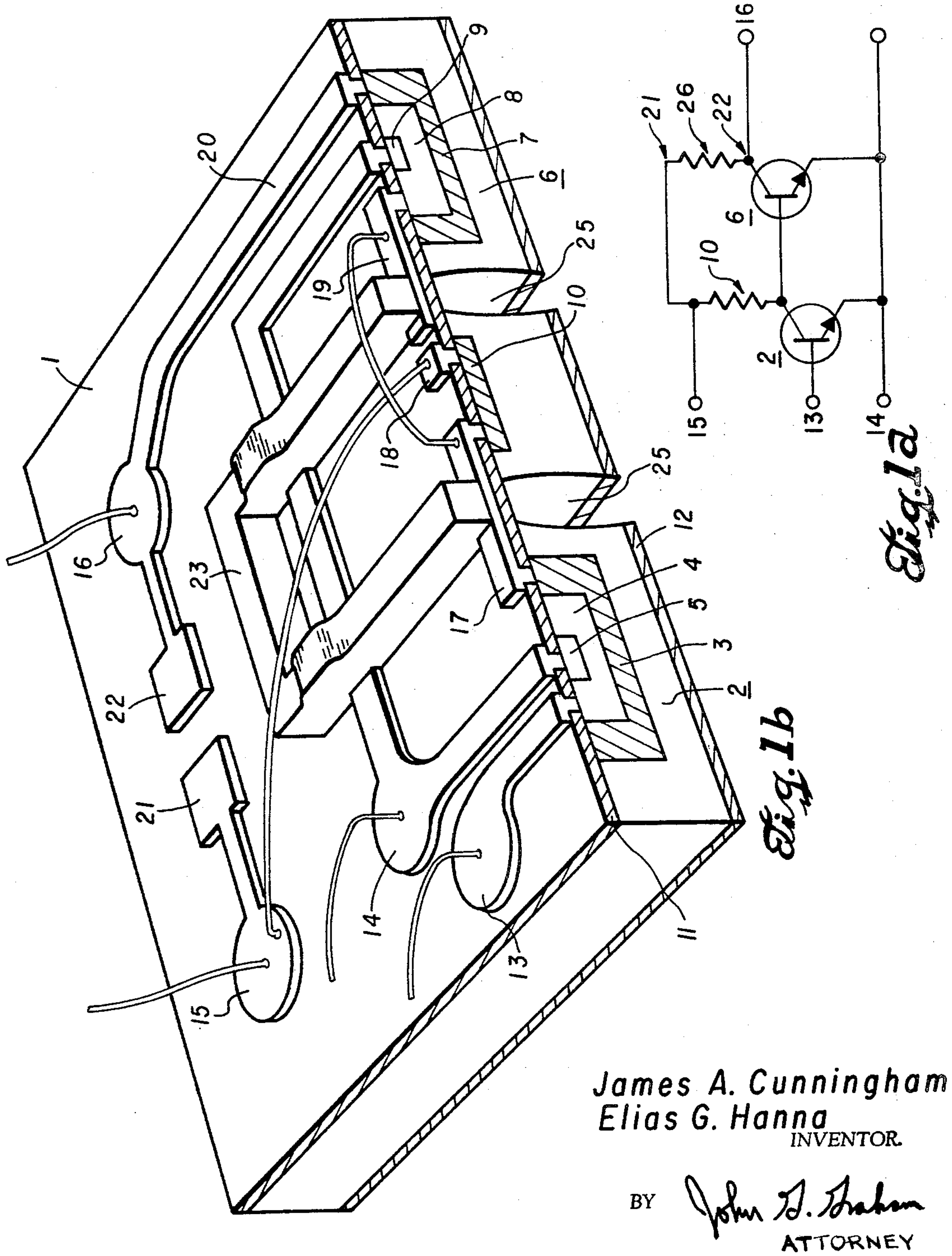
FIGURE 1(*a*) illustrates schematically a simple integrated circuit according to the present invention.

For a more detailed description, with specific reference to FIGURE 1(*a*), lines 14 and 15 are the source connections to provide the DC bias conditions for transistors 2 and 6. Resistor 10 is a bias determining resistor for transistor 6 and the resistor 26, with its contact ends 21 and 22, provides the load impedance, from which the output of transistor 6 can be taken on line 16. Line 13 is the base input connection to transistor 2. The circuit configuration of FIGURE 1(*a*) forms no part of the invention and is in no sense to be construed as a limiting factor, but is merely shown and described to illustrate one of a large number of solid-state circuits which could be embodied in an integrated circuit device fabricated according to the invention.

Referring now to FIGURE 1(*b*), there is illustrated a sectional view of an integrated circuit embodying the circuit of FIGURE 1(*a*). A semiconductor substrate 1 is the starting material, for example, intrinsic silicon, into which transistors 2 (with collector 3, base 4 and emitter 5), transistor 6 (with collector 7, base 8 and emitter 9), resistor 10 and resistor 26 (not illustrated except for metallized contact regions 21 and 22) are selectively diffused, for example, by the well-known silicon oxide and photoresist masking methods. The transistors 2 and 6 could be NPN or PNP and could be silicon, germanium or any of the other well-known semiconductor materials such as gallium arsenide, indium antimonide, etc. Layer 11 represents the silicon oxide material, while layers 13, 14, 15, 16, 17, 18, 19, 20, 21 and 22 all represent metallized contact layers or regions by which either internal connection is made to the regions of the elements or to which external leads can be attached. To complete the electrical connections of the circuit, wires are connected between pads 18 and 15, and between 17 and 19, for example as by ball-bonding techniques. These interconnections could also be accomplished by other methods, such as by the multilevel lead technique whereby layers of cross-hatched metallized leads are electrically isolated from each other by some isolation medium such as glass, ceramic, etc.

A layer 23 of photoresist material is applied in a pattern which closely approximates the pattern which will be etched out to leave the moat 25. The pattern could be round, square, or any other shape desired to insure that the elements will be electrically isolated from each other where desired. Of course, the layer 23 could cover any or all of the top surface without regard to the pattern of the etched moat 25. However, the selective application of layer 23 allows some of the operations, such as attaching leads, to be done either before or after the layer 23 is applied. A layer 12 of photoresist material selectively masks the areas to be etched. A selective etchant, such as CP8, described in "Transistor Technology," volume 2, edited by F. J. Biondi, at page 598, is applied to the back surface to etch through to the silicon oxide layer 11 on the top surface according to the pattern established on the back surface by the photoresist material layer 12.

Figure 2:
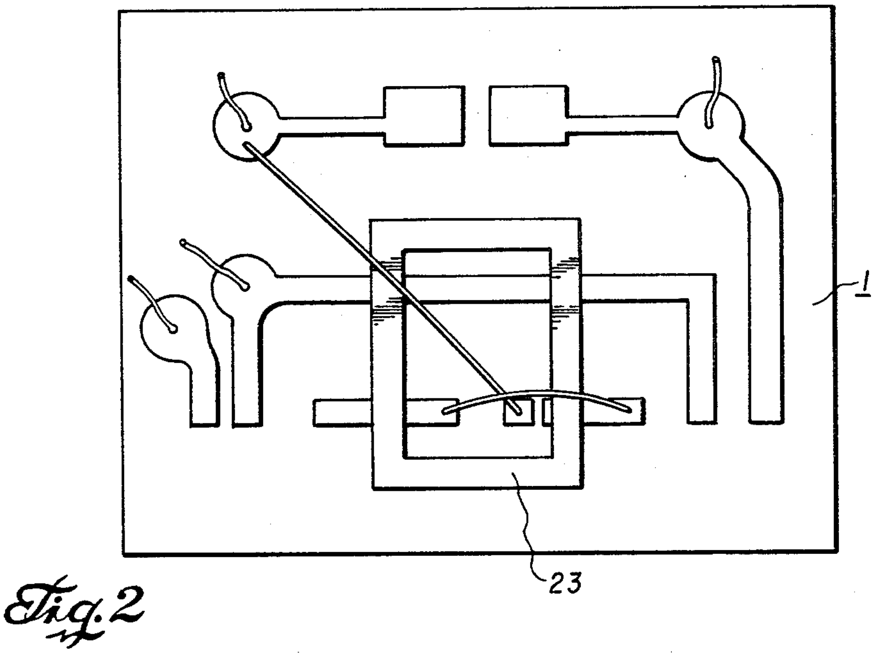
FIGURE 2 illustrates a top plan view of the integrated circuit device of FIGURE 1(*b*)
Figure 3:
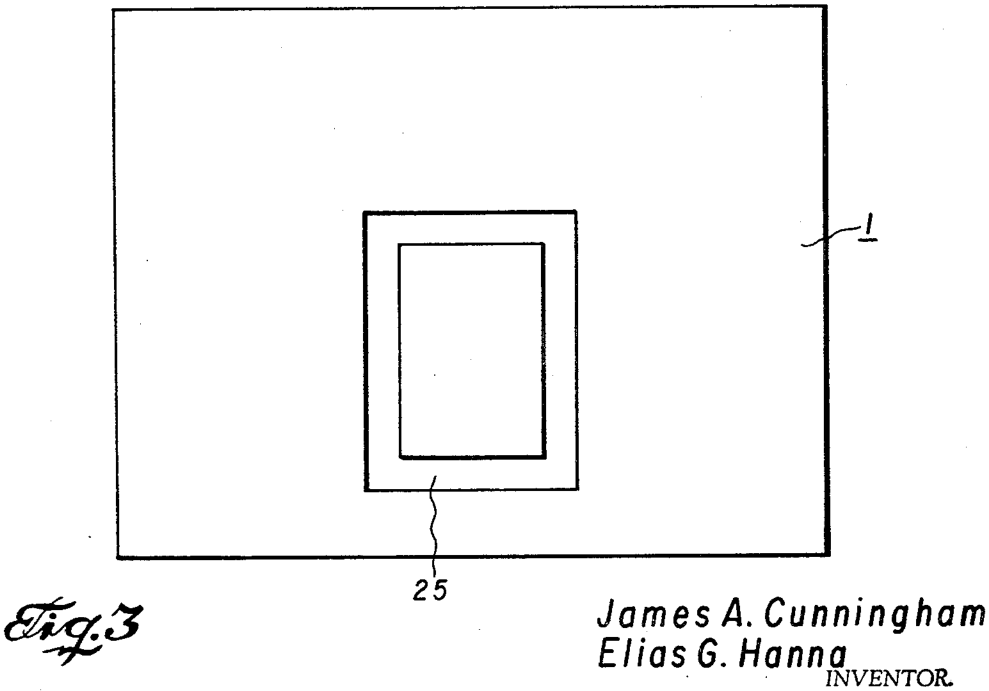
FIGURE 3 illustrates a bottom view of the integrated circuit device of FIGURE 1(*b*).

In FIGURE 2 there is illustrated a top view of the integrated circuit device of FIGURE 1(*b*) to show the complete pattern of the photoresist layer 23, while in FIGURE 3 there is illustrated a bottom view of the device of FIGURE 1(*b*) to show the etched-out moat 25, which, in this example, approximates the pattern of the photoresist layer 23.

Figure 4:
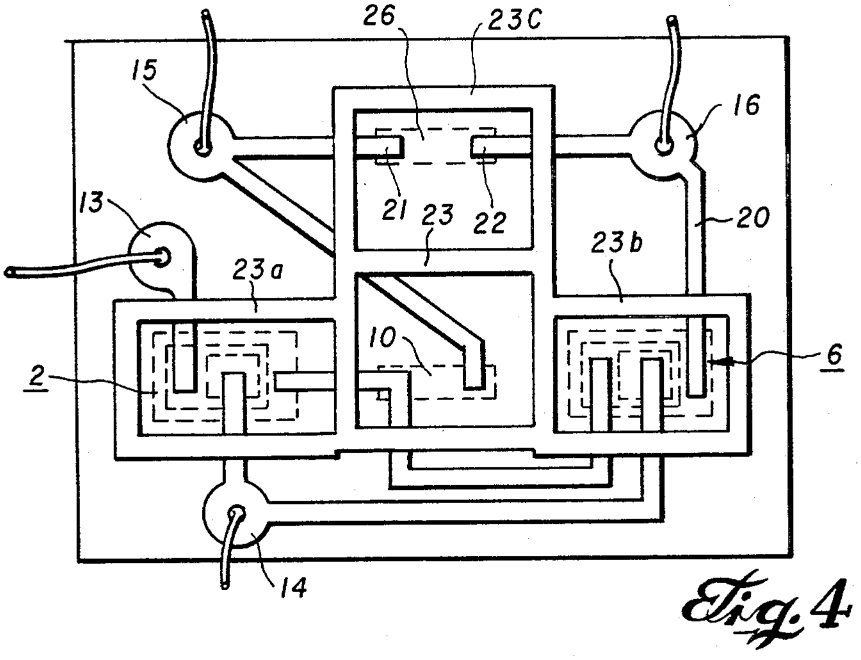
Figure 5:
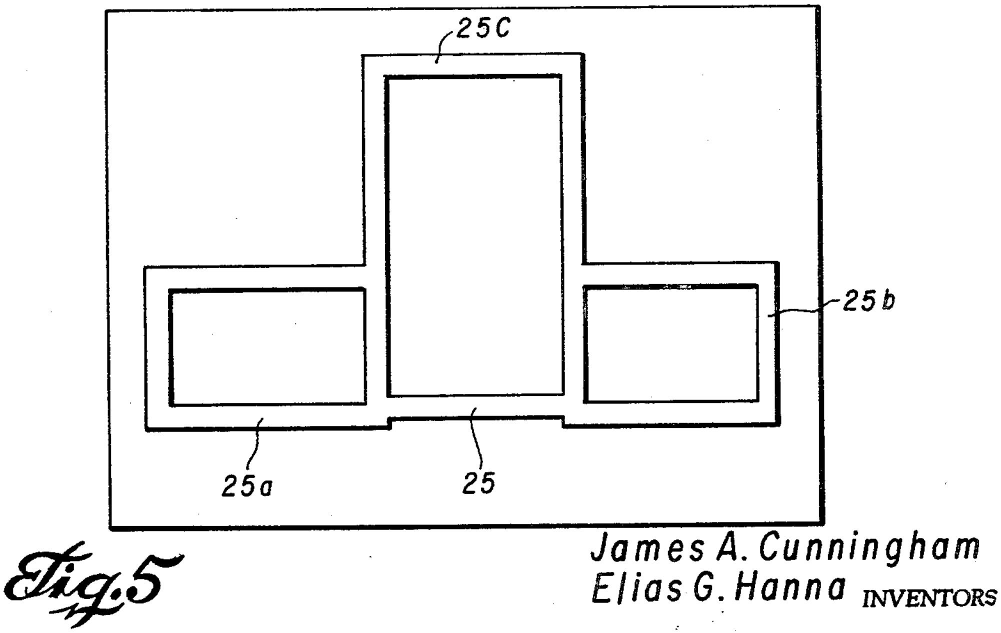

It will be appreciated that instead of having the isolation moat 25 extend around only the resistor 10 it can extend around each of the components of the circuit of FIGURE 1(*a*). This construction is shown in FIGURES 4 and 5 which are respectively a top view and a bottom view of a semiconductor wafer having the components of FIGURE 1(*a*) formed therein. The embodiment of FIGURES 4 and 5 is the same as FIGURE 1(*a*) except that the moat 25 includes extensions **25*a*, 25*b* and 25*c* which encircle the transistors 2 and 6 and the resistor 26 so that each circuit component is insulated through the wafer from each of the others. In this embodiment, incidentally, the substrate may be N-type rather than intrinsic and the collector regions 3 and 7** of the transistors need not be diffused regions but instead would be merely undefined portions of the substrate or the bulk of the wafer, the base regions and the resistors being formed by P-type diffusion and the emitter by an N-type diffusion. This construction would simplify fabrication by eliminating one diffusion. Epitaxial techniques, such as *n* or *n*+ could be used to reduce collector saturation resistance. In construction of the device of FIGURES 4 and 5, a photoresist mask 23 would be used as above, but would include extensions **23*a*, 23*b* and 23*c* around the transistors and the other resistor 26**. Also, this embodiment differs from that of FIGURE 1(*a*) in that deposited metal conductors overlying the silicon oxide coating replace the jumper wires connecting to the ends of the resistor 10.

While the invention has been described in connection with the use of a photoresist material to strengthen the device to overcome the weakening effects of a partial etching away of the back side of the device, it is to be understood that other materials are equally applicable, such as glass, ceramic, or any other available insulation medium which will not affect the electrical characteristics of the circuit elements. Although the invention has been described in simplified form with respect to a small wafer that involves only the isolation of a few elements, it will be appreciated that the invention is equally applicable to more complicated configurations wherein a larger multiplicity of elements are to be isolated within a single unit.

What is claimed is:

1. An integrated circuit device comprising (a) a body having a plurality of semiconductor regions therein, said regions having semiconductor devices formed therein, each region having a face which is coplanar with the other regions, said coplanar faces forming one surface of said body;

(b) an insulating layer covering at least a portion of said one surface;

(c) a layer of nonconductive material upon only a portion of said insulating layer between selected ones of said semiconductor devices to thereby mechanically strengthen said body; and (d) a selectively etched-out region in said body extending from the surface of said body which is opposite said one surface to said insulating layer whereby said semiconductor regions are electrically isolated from each other.

2. The integrated circuit device according to claim 1 wherein said non-conducting layer is comprised of hardened photoresist material.

3. The integrated circuit device according to claim 2 wherein said non-conducting layer is selectively disposed in approximately the same pattern as said etched-out region.

4. The integrated circuit device according to claim 1 wherein said etched-out region contains a gaseous atmosphere.

5. The integrated circuit device according to claim 4 wherein said gaseous atmosphere is air.

6. A device according to claim 1, wherein said non-conducting layer defines a closed configuration having an opening above one of said semiconductor devices.

References Cited

UNITED STATES PATENTS

| | | | |
|---|---|---|---|
| 3,335,338 | 8/1967 | Lepselter | 317—101 |
| 3,307,239 | 3/1967 | Lepselter et al. | |

OTHER REFERENCES

IBM Technical Disclosure Bulletin, "Integrated Circuit Package," R. S. Schwartz, vol. 3, No. 12, May 1961.

ROBERT K. SCHAEFER, *Primary Examiner.*

J. R. SCOTT, *Assistant Examiner.*